United States Patent
Song et al.

(10) Patent No.: US 7,585,755 B2
(45) Date of Patent: Sep. 8, 2009

(54) METHOD OF FABRICATING NON-VOLATILE MEMORY DEVICE

(75) Inventors: Seung-hwan Song, Incheon (KR); Yoon-dong Park, Yongin-si (KR); June-mo Koo, Seoul (KR); Suk-pil Kim, Yongin-si (KR); Jae-woong Hyun, Uijeongbu-si (KR); Choong-ho Lee, Seongnam-si (KR); Tae-hun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 11/978,567

(22) Filed: Oct. 30, 2007

(65) Prior Publication Data

US 2008/0242011 A1 Oct. 2, 2008

(30) Foreign Application Priority Data

Mar. 27, 2007 (KR) ............... 10-2007-0030033

(51) Int. Cl.
  *H01L 21/8239* (2006.01)
  *H01L 29/788* (2006.01)
  *H01L 29/792* (2006.01)
  *H01L 27/105* (2006.01)

(52) U.S. Cl. .............. 438/588; 438/257; 438/259; 438/264; 438/593; 438/594; 257/319; 257/320; 257/E21.662; 257/E21.682; 257/E21.69

(58) Field of Classification Search ............ 438/151, 438/587, 257, 259, 263, 264, 266, 593, 594; 257/E21.7, E27.075–E27.078, E27.084, E27.086, 257/E27.091, E29.17, 314–320

See application file for complete search history.

(56) References Cited

U.S. PATENT DOCUMENTS

| | | | |
|---|---|---|---|
| 5,278,090 A | 1/1994 | Yoshida | 438/242 |
| 5,874,760 A | 2/1999 | Burns et al. | 257/315 |
| 6,156,607 A | 12/2000 | Noble et al. | 438/244 |
| 6,440,801 B1 | 8/2002 | Furukawa et al. | 438/272 |
| 6,849,905 B2 | 2/2005 | Ilkbahar et al. | 257/390 |
| 7,214,983 B2 | 5/2007 | Han et al. | 257/324 |
| 2007/0032018 A1 | 2/2007 | Tuntasood et al. | 438/266 |
| 2007/0063263 A1 | 3/2007 | Oh et al. | 257/316 |
| 2007/0272968 A1 | 11/2007 | Masukawa et al. | 257/315 |
| 2008/0151631 A1 | 6/2008 | Hyun et al. | 365/185.18 |
| 2008/0191264 A1 | 8/2008 | Kim et al. | 257/319 |

FOREIGN PATENT DOCUMENTS

JP  2008160113 A  7/2008

*Primary Examiner*—Zandra Smith
*Assistant Examiner*—Jeremy J Joy
(74) *Attorney, Agent, or Firm*—Harness, Dickey & Pierce, P.L.C.

(57) ABSTRACT

A method of fabricating a non-volatile memory device according to example embodiments may include forming a semiconductor layer on a substrate. A plurality of lower charge storing layers may be formed on a bottom surface of the semiconductor layer. A plurality of lower control gate electrodes may be formed on the plurality of lower charge storing layers. A plurality of upper charge storing layers may be formed on a top surface of the semiconductor layer. A plurality of upper control gate electrodes may be formed on the plurality of upper charge storing layers, wherein the plurality of lower and upper control gate electrodes may be arranged alternately.

24 Claims, 9 Drawing Sheets

METHOD OF FABRICATING NON-VOLATILE MEMORY DEVICE

PRIORITY STATEMENT

This application claims priority under 35 U.S.C. §119 to Korean Patent Application No. 10-2007-0030033, filed on Mar. 27, 2007 in the Korean Intellectual Property Office (KIPO), the entire contents of which are incorporated herein by reference.

BACKGROUND

1. Technical Field

Example embodiments relate to a non-volatile memory device having a charge storing layer and a method of fabricating the same.

2. Description of the Related Art

A conventional non-volatile memory device may have a planar or a three-dimensional structure (e.g., fin). For example, a non-volatile memory device having a fin-type structure may provide higher integration and performance. However, patterning issues in the fin forming process may limit the degree of integration for a non-volatile memory device having a fin-type structure.

SUMMARY

A method of fabricating a non-volatile memory device according to example embodiments may include forming a semiconductor layer on a substrate. A plurality of lower charge storing layers may be formed on a bottom surface of the semiconductor layer. A plurality of lower control gate electrodes may be formed on the plurality of lower charge storing layers. A plurality of upper charge storing layers may be formed on a top surface of the semiconductor layer. A plurality of upper control gate electrodes may be formed on the plurality of upper charge storing layers. The plurality of lower and upper control gate electrodes may be arranged alternately.

The method may also include forming a string erase electrode connected to the semiconductor layer. The method may further include forming a plurality of charge storing layers surrounding the semiconductor layer. A plurality of control gate electrodes may be formed on the plurality of charge storing layers. Upper portions of the plurality of charge storing layers and control gate electrodes above the semiconductor layer may be removed. Accordingly, lower portions of the plurality of charge storing layers may be referred to as lower charge storing layers, and lower portions of the plurality of control gate electrodes may be referred to as lower control gate electrodes.

DETAILED DESCRIPTION OF EXAMPLE EMBODIMENTS

Figure 1:
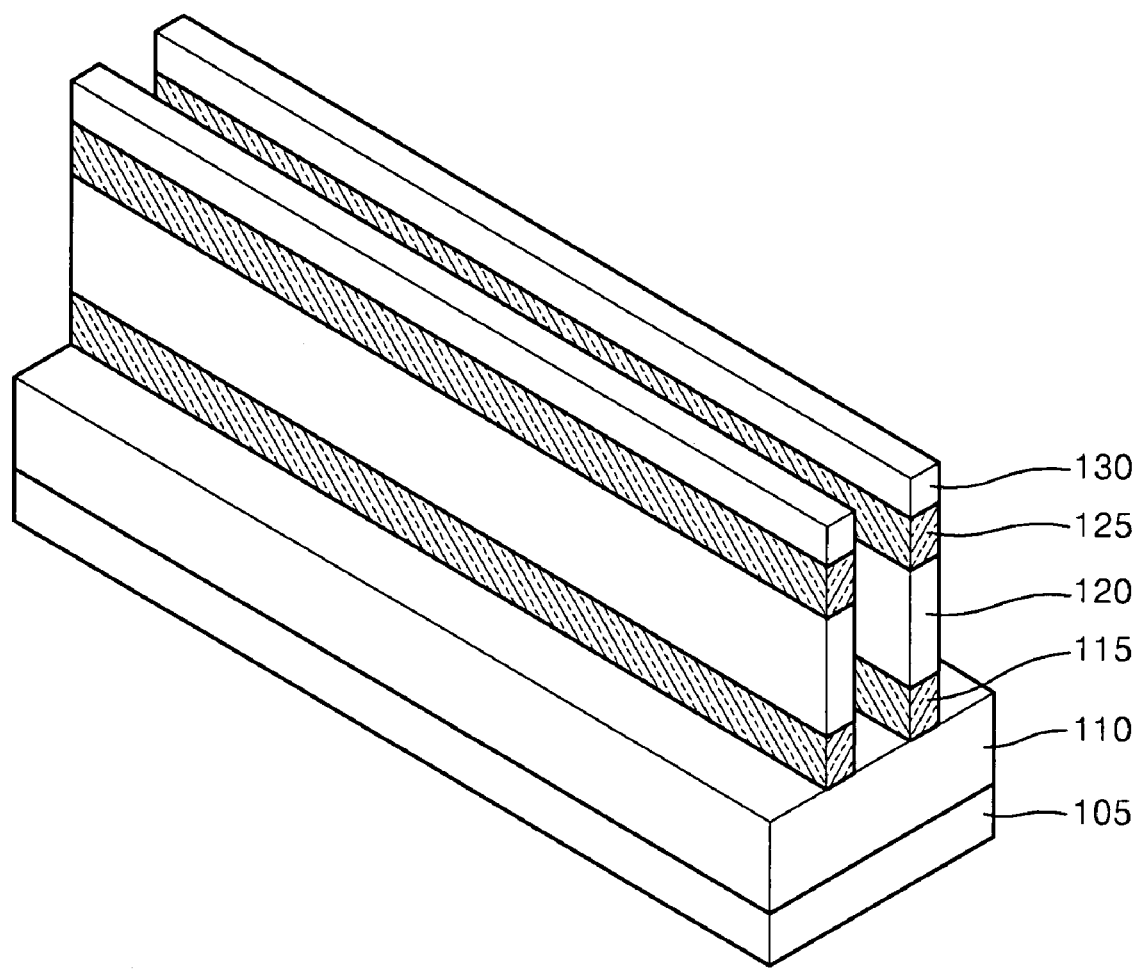
FIGS. 1-5, 7, 9, 11, and 13 are perspective views illustrating a method of fabricating a non-volatile memory device according to example embodiments.

Example embodiments will now be described in further detail with reference to the accompanying drawings. In the drawings, the thicknesses of layers and regions may have been exaggerated for clarity.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIGS. 1 through 14 are perspective and cross-sectional views illustrating a non-volatile memory device according to example embodiments and a method of fabricating the same. Referring to FIG. 1, a buried insulating layer 110 may be formed on a substrate 105. A semiconductor layer 115, a first interlayer dielectric layer 120, a first sacrificial layer 125, and a second interlayer dielectric layer 130 may be sequentially formed on the buried insulating layer 110. The first interlayer dielectric layer 120, the first sacrificial layer 125, and the second interlayer dielectric layer 130 may be patterned on the buried insulating layer 110 to have a predetermined width.

The semiconductor layer 115 may include silicon. For example, the substrate 105, the buried insulating layer 110, and the semiconductor layer 115 may be provided as a Si on insulator (SOI) wafer. The SOI wafer may be commercially available. The semiconductor layer 115 may also include Ge or SiGe. For example, the substrate 105, the buried insulating layer 110, and the semiconductor layer 115 may be provided as a Ge or SiGe on insulator wafer.

The semiconductor layer 115 may be formed on the buried insulating layer 110 using a chemical vapor deposition (CVD) method. When the semiconductor layer 115 is directly formed on the buried insulating layer 110, the semiconductor layer 115 may have a polycrystalline structure. However, when the substrate 105 has a single crystalline structure, the semiconductor layer 115 may be formed into a single crystalline structure via passage of the crystalline material through the buried insulating layer 110 from the substrate 105 using an epitaxial deposition method. The buried insulating layer 110 and the first and second interlayer dielectric layers 120 and 130 may include the same insulating material (e.g., an oxide layer). The first sacrificial layer 125 may be formed of the same material as the semiconductor layer 115. For example, the first sacrificial layer 125 may include Si, Ge, or SiGe.

Figure 2:
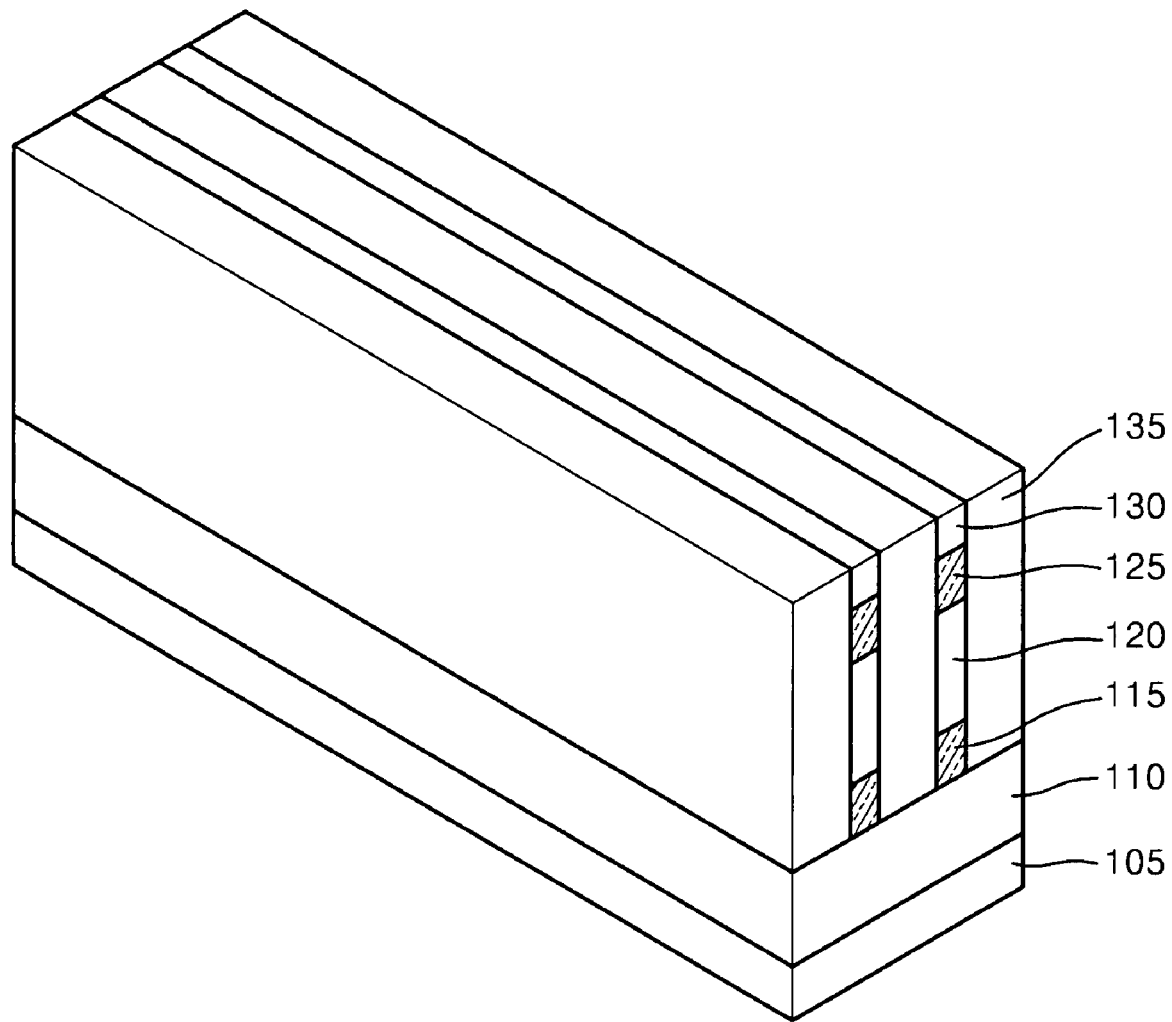

Referring to FIG. 2, a mold insulating layer 135 may be formed to surround the semiconductor layer 115 and the first sacrificial layer 125. The mold insulating layer 135 may be formed of the same material as the first and second interlayer dielectric layers 120 and 130. Thus, the mold insulating layer 135 and the first and second interlayer dielectric layers 120 and 130 may not be differentiated from one another. For example, the mold insulating layer 135 may include an oxide. However, the buried insulating layer 110 and the mold insulating layer 135 may be differentiated based on differences in etching speeds. For example, the buried insulating layer 110 and the mold insulating layer 135 may be formed as a thermally-oxidized layer and a TEOS oxide layer, respectively.

Figure 3:
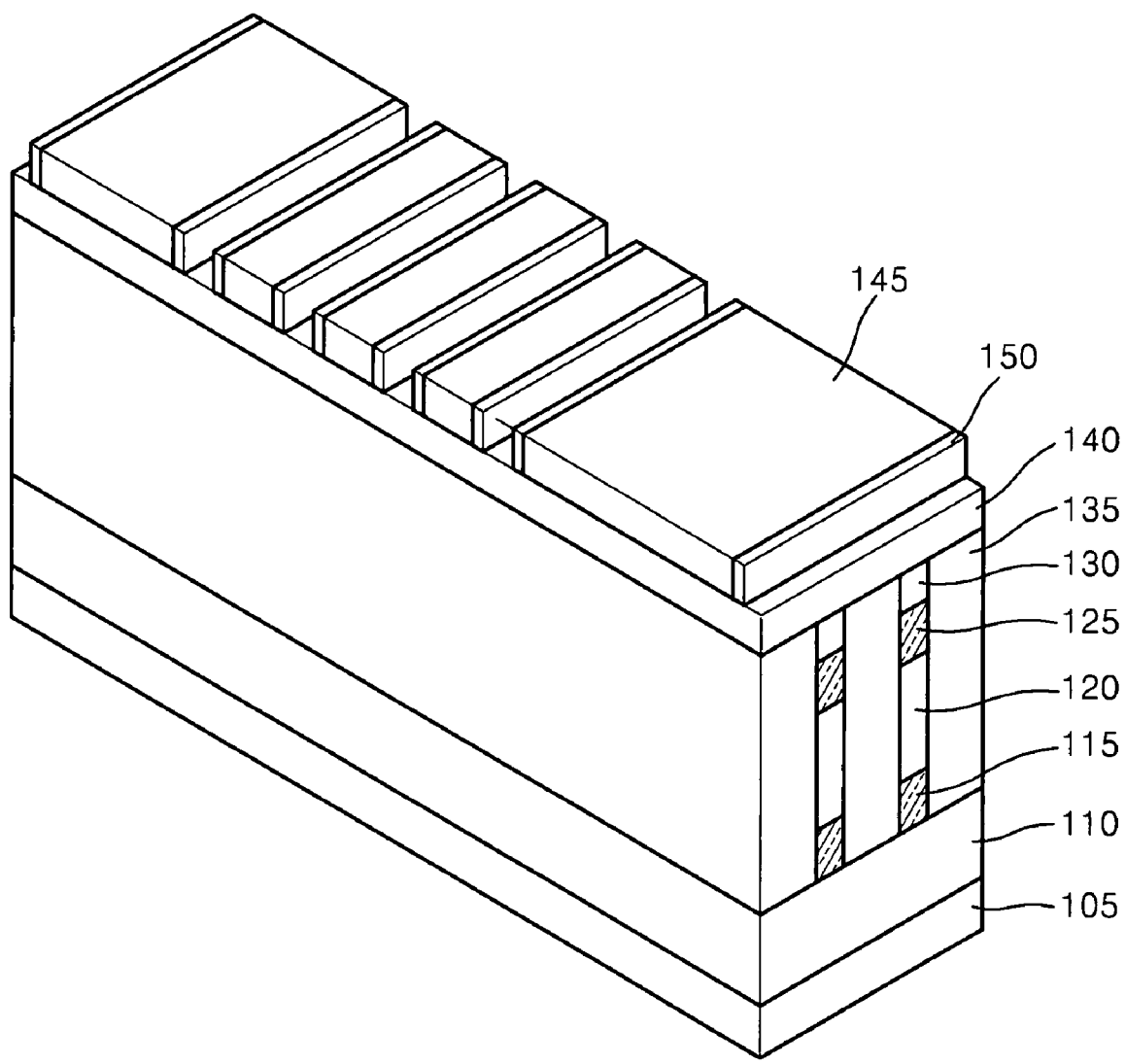

Referring to FIG. 3, a second sacrificial layer 140 may be formed on the mold insulating layer 135. The second sacrificial layer 140 may be formed of the same material as the first sacrificial layer 125. For example, the second sacrificial layer 140 may include Si, Ge, or SiGe. A mask layer 145 and a sidewall spacer 150 may be formed on the second sacrificial layer 140. The mask layer 145 may be formed to have an etching selectivity with respect to the second sacrificial layer 140. For example, the mask layer 145 may include a nitride. The sidewall spacer 150 may be formed on both sidewalls of the mask layer 145. The sidewall spacer 150 may include an oxide or a nitride. The sidewall spacer 150 may substantially reduce the width of the portion of the second sacrificial layer 140 exposed by the mask layer 150. Thus, the sidewall spacer 150 may be omitted depending on the photolithography technology for forming the mask layer 145.

Figure 4:
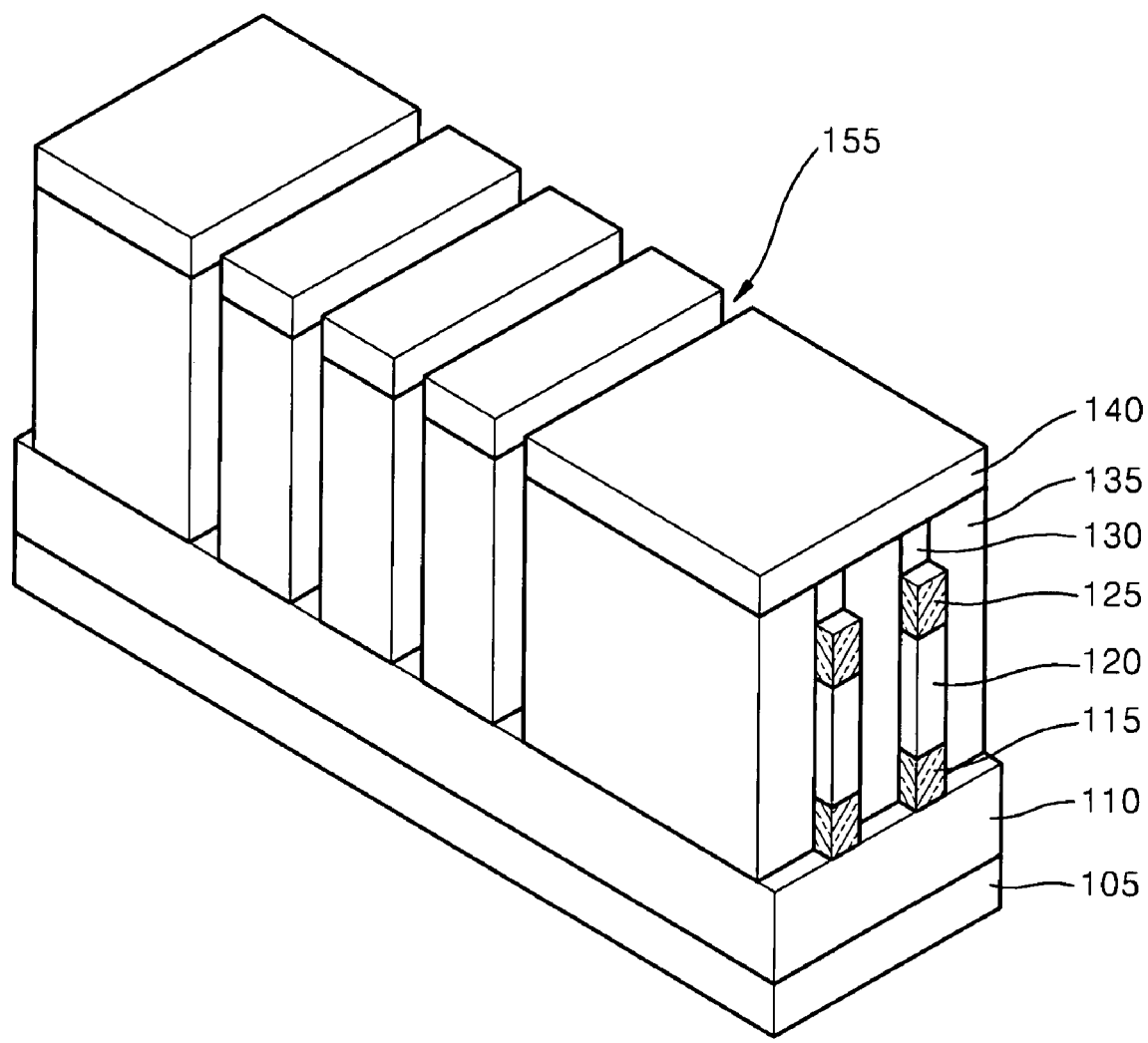

Referring to FIG. 4, the second sacrificial layer 140 may be etched using the mask layer 145 and the sidewall spacer 150 as a protection layer. A plurality of trenches 155 may be formed by selectively etching the mold insulating layer 135 and the second interlayer dielectric layer 130 using the second sacrificial layer 140 as a protection layer. For example, the second sacrificial layer 140, the mold insulating layer 135, and the second interlayer dielectric layer 130 may be anisotropically etched using a dry etching technique.

Alternatively, the second sacrificial layer 140 may be omitted, and the mold insulating layer 135 and the second interlayer dielectric layer 130 may be anisotropically etched using the mask layer 145 and the sidewall spacer 150 as a protection layer. The mask layer 145 and the sidewall spacer 150 may be removed. The exposed first and second sacrificial layers 125 and 140 may also be removed. The first sacrificial layer 125 which is not exposed by the second interlayer dielectric layer 130 may not be removed.

Figure 5:
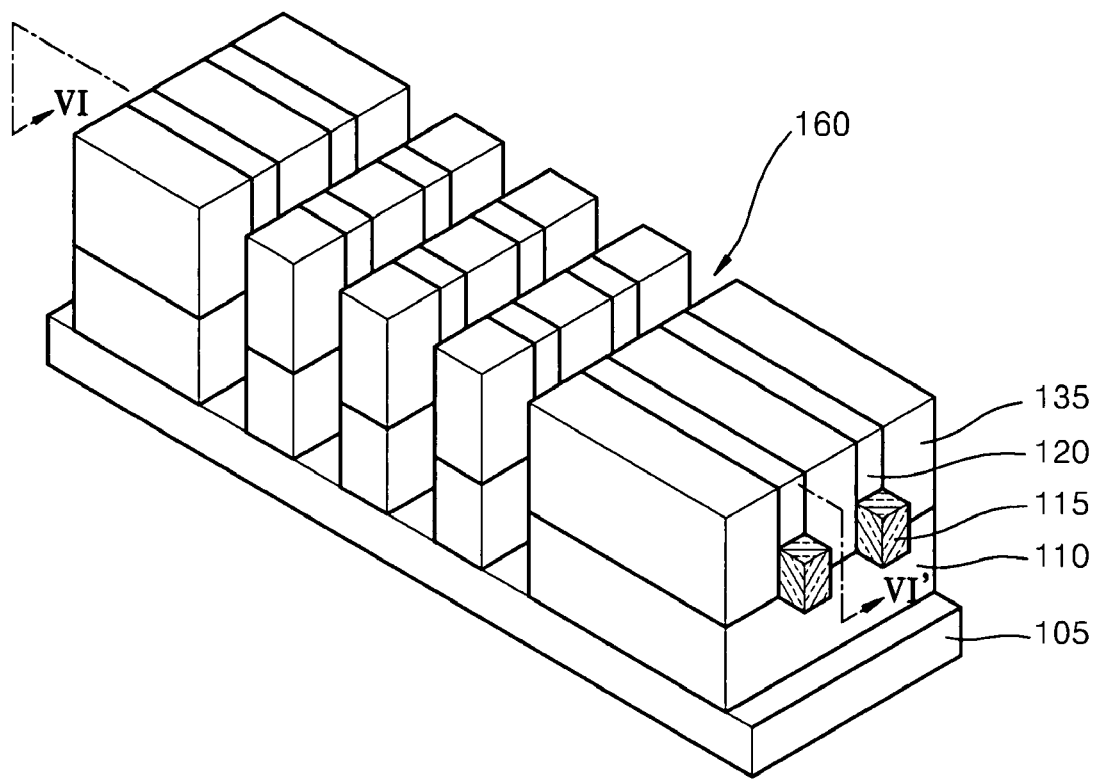
Figure 6:
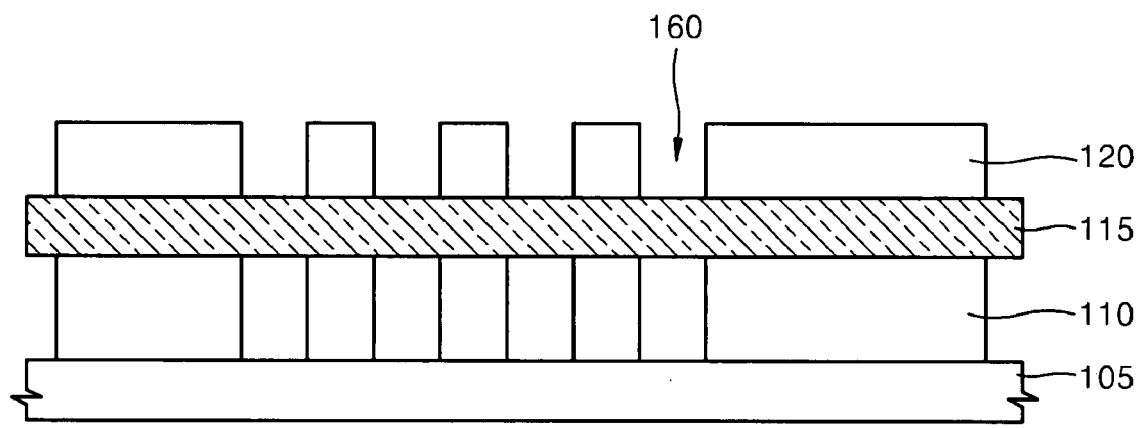
FIG. 6 is a cross-sectional view taken along line VI-VI' of the non-volatile memory device of FIG. 5.

Referring to FIGS. 5 and 6, the first interlayer dielectric layer 120, the mold insulating layer 135, and the second interlayer dielectric layer 130 may be anisotropically etched. The mold insulating layer 135 may be anisotropically etched to a predetermined height such that the first interlayer dielectric layer 120 is sufficiently exposed below the first sacrificial layer 125. The first interlayer dielectric layer 120 may be isotropically etched so as to also remove the first sacrificial layer 125 and the mold insulating layer 135. For example, dry etching may be used for anisotropic etching, and wet etching may be used for isotropic etching.

The buried insulating layer 110 exposed in the anisotropic etching operation may be etched such that the depth of the trenches 160 may be deepened. During the isotropic etching operation, the width of the trenches 160 may be increased, and the buried insulating layer 110 beneath the semiconductor layer 115 may be removed. Accordingly, each of the trenches 160 may expose the top, bottom, and side surfaces of semiconductor layer 115.

Figure 7:
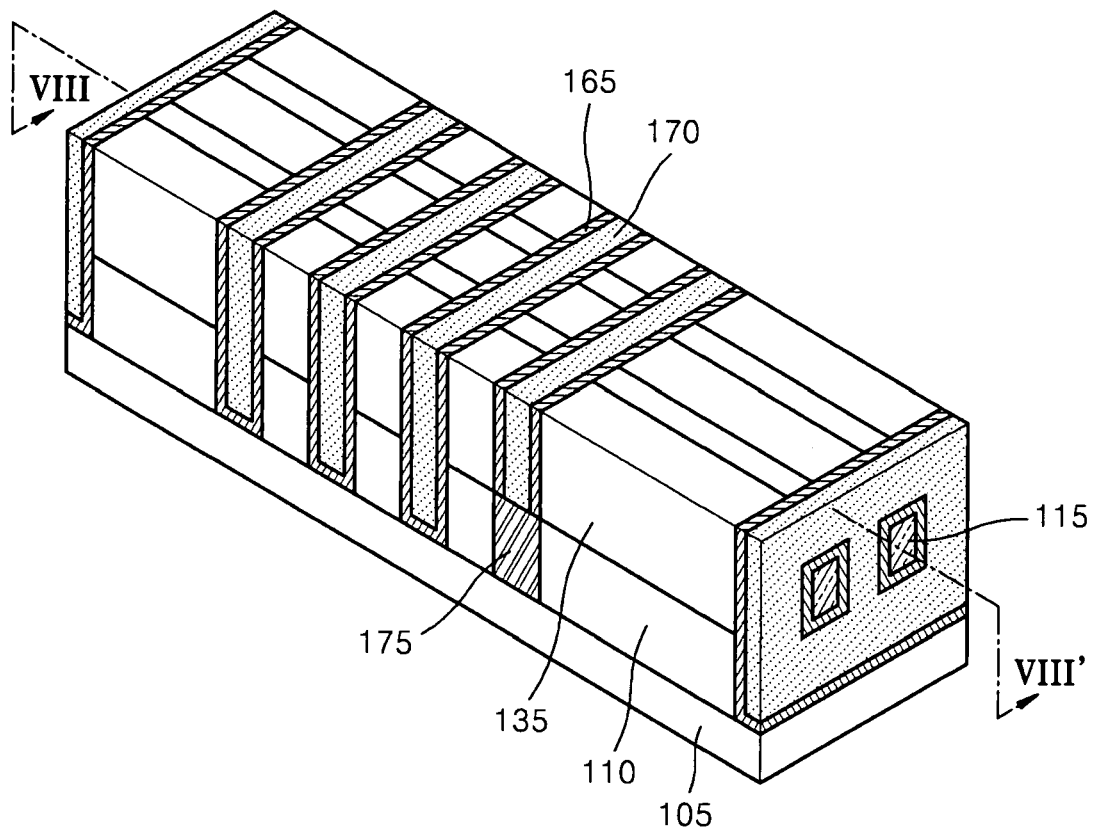
Figure 8:
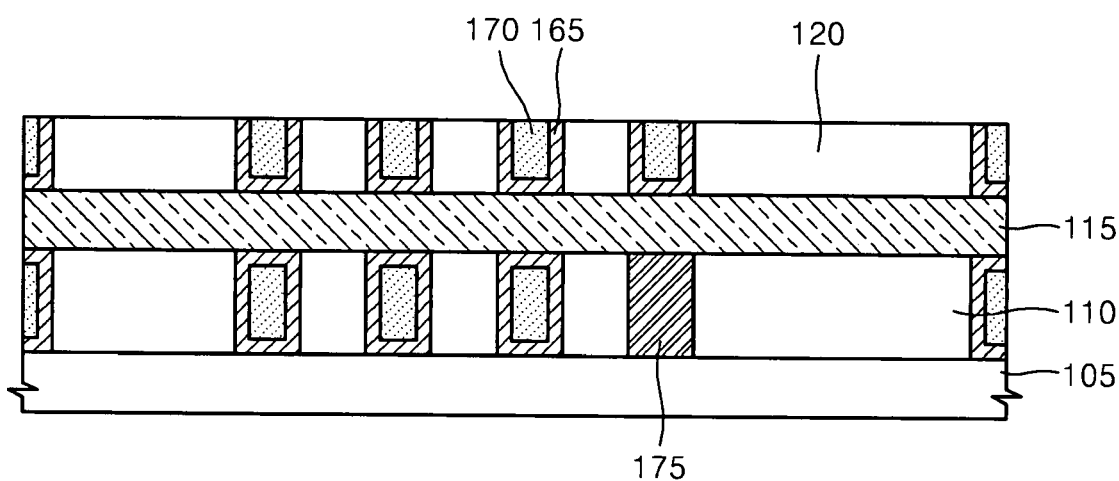
FIG. 8 is a cross-sectional view taken along line VIII-VIII' of the non-volatile memory device of FIG. 7.

Referring to FIGS. 7 and 8, a plurality of charge storing layers 165 may be formed on and around the portions of the semiconductor layer 115 exposed by the trenches 160. For example, the charge storing layers 165 may be formed by a CVD method and, thus, may also be formed on surfaces of the substrate 105, the buried insulating layer 110, the first interlayer dielectric layer 120, and the mold insulating layer 135 exposed by the trenches 160. The charge storing layers 165 may include a poly-silicon, nitride layer, nanodots, or nanocrystal. The poly-silicon may be used as a floating node. The nitride layer, nanodots, or nanocrystal may be a local trap node. The nanodots or nanocrystal may include a relatively fine structure of a metal or semiconductor material. A plurality of control gate electrodes 170 may be respectively formed on the charge storing layers 165 so as to fill the trenches 160. For example, the control gate electrodes 170 may be formed by filling the trenches 160 with a conductive layer and performing a planarizing process. The control gate electrodes 170 may include a poly-silicon, metal, or metal silicide.

A plurality of tunneling insulating layers (not shown) may also be interposed between the charge storing layers 165 and the semiconductor layer 115. A plurality of blocking insulating layers (not shown) may be further interposed between the charge storing layers 165 and the control gate electrodes 170. The tunneling and blocking insulating layers may include an oxide layer, nitride layer, or a higher dielectric constant layer. Alternatively, an upper or lower portion of a pair of the charge storing layer 165 and the control gate electrode 170 may be removed, and a string erase electrode 175 may be formed so as to be connected to the semiconductor layer 115. For example, the string erase electrode 175 may be positioned at the outermost side of the control gate electrodes 170 and formed on or beneath the semiconductor layer 115 so as to be parallel with the control gate electrodes 170. The string erase electrode 175 may be used to apply power directly to the semiconductor layer 115.

Figure 9:
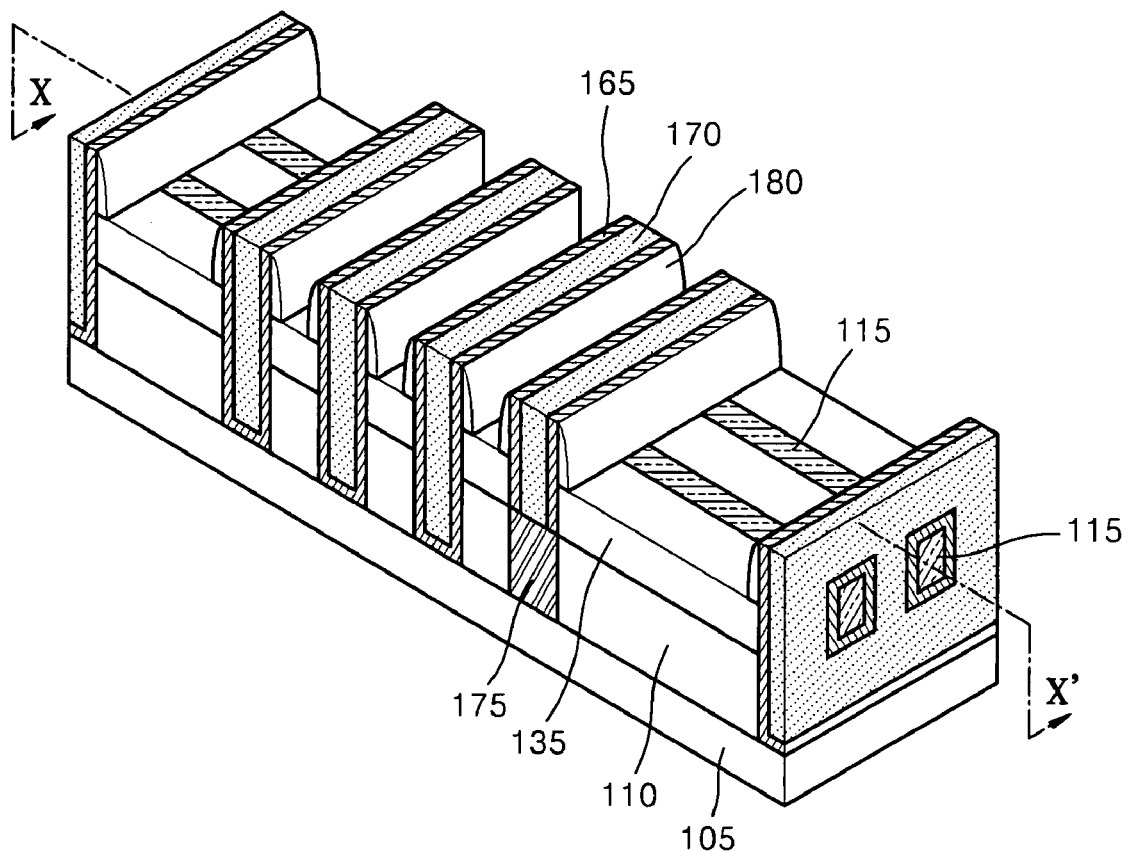
Figure 10:
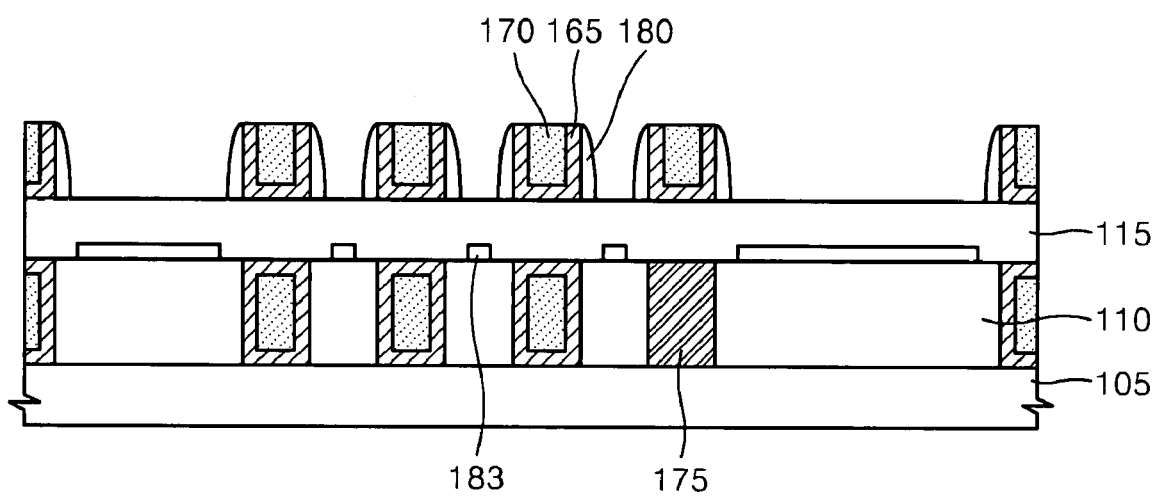
FIG. 10 is a cross-sectional view taken along line X-X' of the non-volatile memory device of FIG. 9.

Referring to FIGS. 9 and 10, the upper portions of the control gate electrodes 170 may be exposed by removing the mold insulating layer 135 above the semiconductor layer 115. Thus, the top surface and/or side surface of the semiconductor layer 115 may be exposed. Alternatively, the mold insulating layer 135 may be completely removed. A plurality of spacer insulating layers 180 may be formed on upper sidewalls of the control gate electrodes 170. For example, the spacer insulating layers 180 may be formed by providing an oxide layer on the control gate electrodes 170 and anisotropically etching the oxide layer.

A first source and drain region 183 may be formed in a lower portion of the semiconductor layer 115 between the spacer insulating layers 180. For example, when the semiconductor layer 115 is of a first conductive type, the first source and drain region 183 may be doped with a second conductive type impurity. The first and second conductive types may be an n-type and a p-type, respectively, or a p-type and an n-type, respectively. The energy for implanting the second conductive type impurity into the semiconductor layer 115 may be controlled so as to confine the second conductive type impurity to a lower portion of the semiconductor layer 115.

Figure 11:
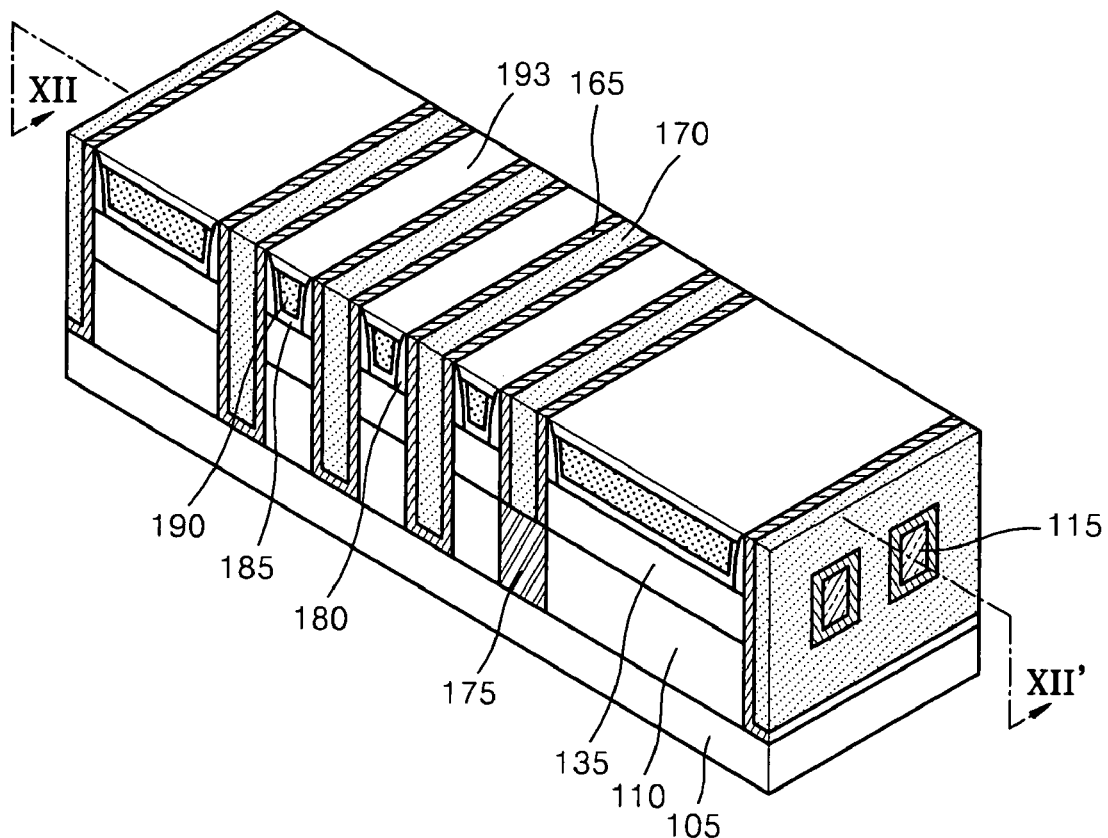
Figure 12:
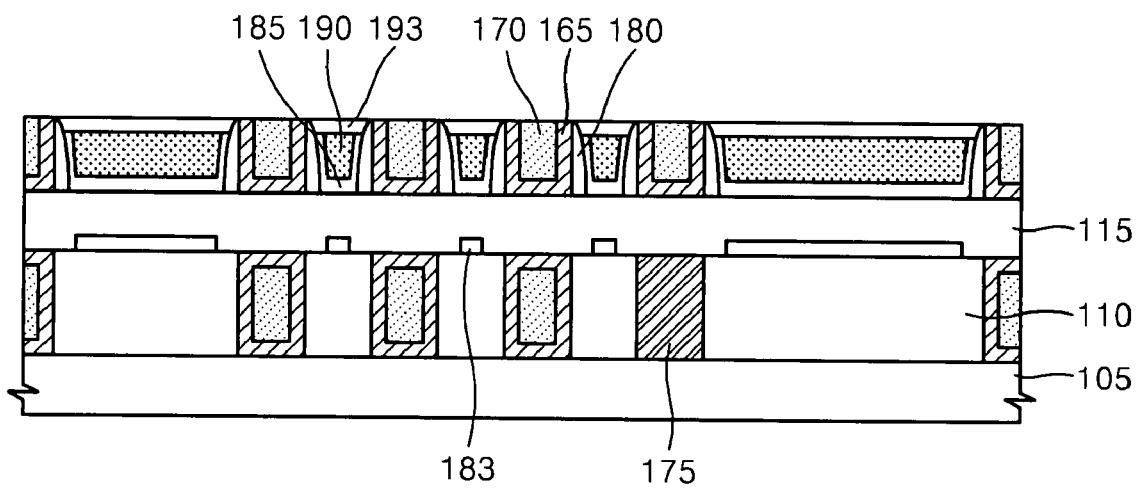
FIG. 12 is a cross-sectional view taken along line XII-XII' of the non-volatile memory device of FIG. 11.

Referring to FIGS. 11 and 12, a plurality of upper charge storing layers 185 may be formed on the semiconductor layer 115 between the spacer insulating layers 180. The upper charge storing layers 185 may include a poly-silicon, nitride layer, nanodots, or nanocyrstal. A plurality of upper control gate electrodes 190 may be respectively formed on the upper charge storing layers 185 so as to fill at least portions of the spaces between the spacer insulating layers 180. For example, the upper control gate electrodes 190 may be formed by filling a conductive layer between the spacer insulating layers 180 and planarizing the conductive layer. The upper control gate electrodes 190 may include a poly-silicon, metal, or metal silicide.

A plurality of upper tunneling insulating layers (not shown) may also be interposed between the semiconductor layer 115 and the upper charge storing layers 185. A plurality of upper blocking insulating layers (not shown) may be further interposed between the upper charge storing layers 185 and the upper control gate electrodes 190. The upper tunneling and upper blocking insulating layers may include an oxide layer, nitride layer, or higher dielectric constant layer.

The upper control gate electrodes 190, the upper charge storing layers 185, and the upper portion of the semiconductor layer 115 may constitute a plurality of upper memory transistors. The number of upper memory transistors may be appropriately provided based on the desired capacity of a non-volatile memory device. Capping layers 193 may be formed on the upper control gate electrodes 190 to additionally fill the spaces between the spacer insulating layers 185. The capping layer 193 may be formed to have an etching selectivity with respect to the control gate electrode 170. The capping layer 193 may include a nitride.

Figure 13:
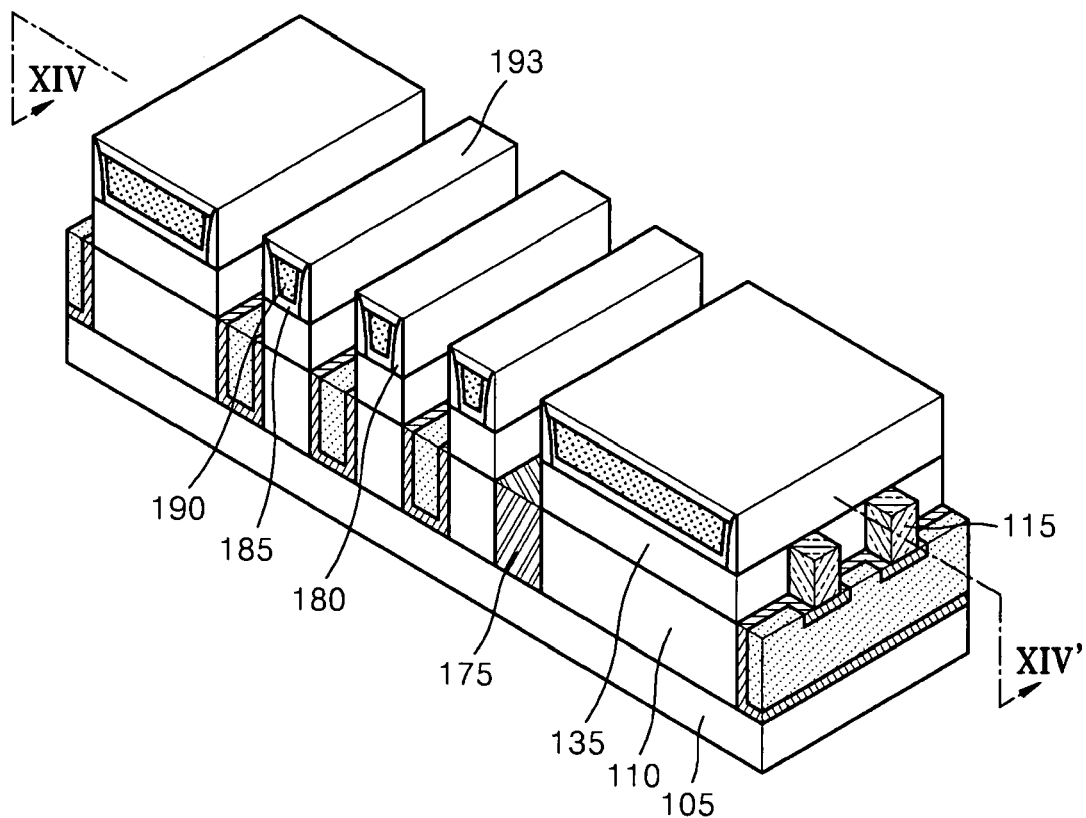
Figure 14:
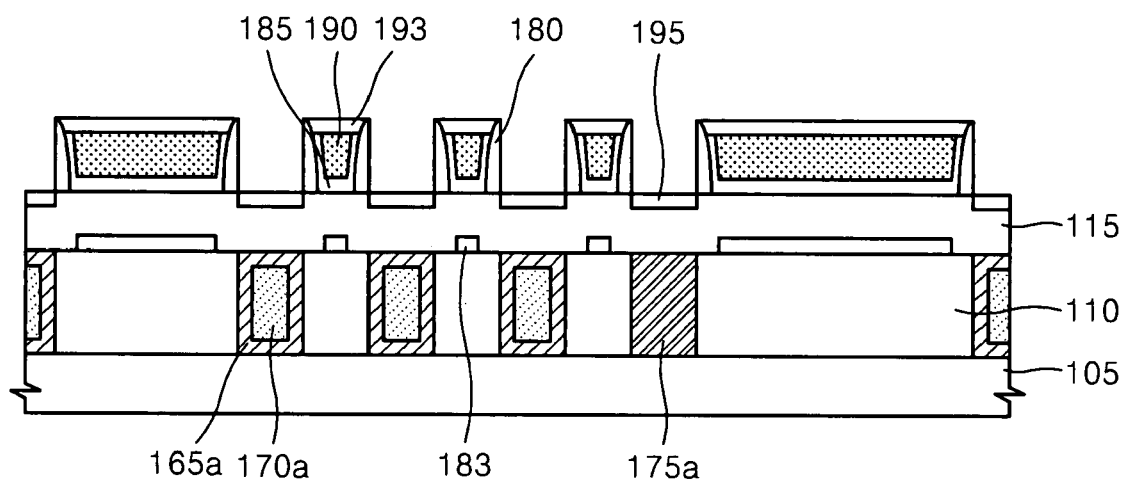
FIG. 14 is a cross-sectional view taken along line XIV-XIV' of the non-volatile memory device of FIG. 13.

Referring to FIGS. 13 and 14, the upper portions of the control gate electrodes 170 and the charge storing layers 165 may be etched using the capping layer 193 as a protection layer. During the etching operation, the spacer insulating layers 180 may protect the upper charge storing layers 185 and the upper control gate electrodes 190. The remaining lower portions of the control gate electrodes 170 may be referred to as lower control gate electrodes 170a. Similarly, the remaining lower portions of the charge storing layers 165 may be referred to as lower charge storing layers 165a. Additionally, the remaining lower portion of the string erase electrode 175 may be referred to as a lower string erase electrode 175a. Alternatively, the remaining upper portion of the string erase electrode 175 may be referred to as an upper string erase electrode (not shown).

The lower control gate electrodes 170a, the lower charge storing layers 165a, and the lower portion of the semiconductor layer 115 may constitute a plurality of lower memory transistors. The number of lower memory transistors may be appropriately provided based on the desired capacity of a non-volatile memory device. A second source and drain region 195 may be formed in an upper portion of the semiconductor layer 115 between the spacer insulating layers 180. The second source and drain region 195 may be formed by doping second conductive type impurities into the semiconductor layer 115. The first and second source and drain regions 183 and 195 may be arranged alternately.

A non-volatile memory device according to example embodiments may also be provided as described below. The first and second sacrificial layers 125 and 140 and the first and second interlayer dielectric layers 120 and 130 may be omitted. For example, the mold insulating layer 135 may be formed to surround the semiconductor layer 115, and the trenches 160 may be formed by performing dry and wet etching with respect to the mold insulating layer 135 and the buried insulating layer 110.

The first and/or second source and drain regions 183 and 195 may also be omitted. For example, the lower memory transistors may be electrically connected using a fringing field produced by the lower control gate electrodes 170a. Similarly, the upper memory transistors may be electrically connected using a fringing field produced by the upper control gate electrodes 190. The fringing field may refer to an electric field in a lateral direction.

Additional details regarding the structures and operating characteristics of non-volatile memory devices according to example embodiments will be provided below. Referring to FIGS. 13 and 14, a non-volatile memory device according to example embodiments may have a NAND structure. The plurality of upper memory transistors may form one NAND string on the semiconductor layer 115, and the plurality of lower memory transistors may form another NAND string beneath the semiconductor layer 115. Selection transistors may be further positioned at both ends of the NAND string of the upper and/or lower memory transistors. Thus, a pair of NAND strings may be respectively formed on and beneath the semiconductor layer 115. Consequently, a non-volatile memory device according to example embodiments may have a degree of integration of about two times higher than a conventional non-volatile memory device.

As mentioned above, the first and second source and drain regions 183 and 195 may be omitted if a fringing field is used. As a result, the degree of integration of a non-volatile memory device may be increased, because the upper and lower control gate electrodes 190 and 170a may be arranged closer to each other. For example, the upper and lower portions of the semiconductor layer 115 may electrically form one string. The structures and operations of non-volatile memory devices may also be provided in Korean Patent Application No. 2006-0133093, the entire contents of which are incorporated herein by reference.

As described above, a non-volatile memory device according to example embodiments may have a higher degree of integration than a conventional non-volatile memory device. For example, upper and lower control gate electrodes may be arranged alternately with a semiconductor layer interposed therebetween, such that a non-volatile memory device according to example embodiments may have a degree of integration of about two times higher than a conventional non-volatile memory device. Additionally, the degree of integration may be further increased by omitting source and drain regions in the memory transistors.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of fabricating a non-volatile memory device, comprising:
    forming a semiconductor layer on a substrate;
    forming a plurality of lower charge storing layers on a bottom surface of the semiconductor layer;
    forming a plurality of lower control gate electrodes on the plurality of lower charge storing layers;
    forming a plurality of upper charge storing layers on a top surface of the semiconductor layer; and
    forming a plurality of upper control gate electrodes on the plurality of upper charge storing layers,
    wherein the plurality of lower and upper control gate electrodes are arranged alternately.

2. The method of claim 1, further comprising:
    forming a string erase electrode connected to the semiconductor layer.

3. The method of claim 2, wherein the string erase electrode is formed in parallel with the plurality of lower or upper control gate electrodes.

4. The method of claim 1, further comprising:
    forming a buried insulating layer on the substrate prior to forming the semiconductor layer.

5. The method of claim 1, wherein the semiconductor layer includes Si, Ge, or SiGe.

6. The method of claim 5, wherein the semiconductor layer on the substrate is provided as a Si on insulator (SOI) wafer, Ge on insulator wafer, or SiGe on insulator wafer.

7. The method of claim 1, wherein forming the plurality of lower charge storing layers and lower control gate electrodes includes:
    forming a plurality of charge storing layers surrounding the semiconductor layer;
    forming a plurality of control gate electrodes on the plurality of charge storing layers; and
    removing upper portions of the plurality of charge storing layers and control gate electrodes above the semiconductor layer.

8. The method of claim 7, further comprising:
    forming a mold insulating layer on a buried insulating layer on the substrate; and
    etching the mold insulating layer and the buried insulating layer to form a plurality of trenches exposing the semiconductor layer before forming the plurality of charge storing layers.

9. The method of claim 8, wherein the plurality of charge storing layers are formed on etched surfaces of the mold insulating layer and the buried insulating layer.

10. The method of claim 8, wherein the plurality of control gate electrodes are respectively formed on the plurality of charge storing layers to fill the plurality of trenches.

11. The method of claim 8, wherein forming the plurality of trenches includes:
    dry etching the mold insulating layer and the buried insulating layer to expose the semiconductor layer; and
    wet etching the buried insulating layer beneath the semiconductor layer.

12. The method of claim 8, wherein the mold insulating layer and the buried insulating layer include an oxide.

13. The method of claim 11, wherein a width of each of the plurality of trenches is increased by the wet etching.

14. The method of claim 11, further comprising:
    providing a mask layer on the mold insulating layer as a protection layer during the dry etching.

15. The method of claim 14, further comprising:
    providing a sidewall spacer on a side surface of the mask layer as a protection layer during the dry etching.

16. The method of claim 8, further comprising:
    forming a first sacrificial layer on the semiconductor layer before forming the mold insulating layer.

17. The method of claim 16, wherein the first sacrificial layer is removed by wet etching.

18. The method of claim 7, wherein the plurality of upper charge storing layers is formed on the top surface of the semiconductor layer between the plurality of control gate electrodes before removing the upper portions of the plurality of charge storing layers and control gate electrodes.

19. The method of claim 8, wherein forming the plurality of upper charge storing layers includes:
    removing the mold insulating layer to expose the upper portions of the plurality of control gate electrodes;
    forming a plurality of spacer insulating layers on upper sidewalls of the plurality of control gate electrodes; and
    forming the plurality of upper charge storing layers on the top surface of the semiconductor layer between the plurality of spacer insulating layers.

20. The method of claim 19, wherein the plurality of upper control gate electrodes are respectively formed on the plurality of upper charge storing layers between the plurality of spacer insulating layers.

21. The method of claim 19, further comprising:
forming a first source and drain region in the lower portion of the semiconductor layer between the plurality of spacer insulating layers.

22. The method of claim 7, further comprising:
forming a capping layer on the plurality of upper control gate electrodes,
wherein the capping layer is used as a protection layer when removing the upper portions of the plurality of charge storing layers and control gate electrodes.

23. The method of claim 22, wherein the capping layer has an etching selectivity with respect to the plurality of control gate electrodes.

24. The method of claim 7, further comprising:
forming a second source and drain region in a upper portion of the semiconductor layer between the plurality of upper control gate electrodes.

* * * * *